(12) United States Patent  
Cowburn

(10) Patent No.: US 7,502,244 B2  
(45) Date of Patent: Mar. 10, 2009

(54) DATA STORAGE DEVICE

(75) Inventor: Russell Paul Cowburn, Durham (GB)

(73) Assignee: Eastgate Investments Limited (BM)

( * ) Notice: Subject to any disclaimer, the term of this patent is extended or adjusted under 35 U.S.C. 154(b) by 618 days.

(21) Appl. No.: 10/508,904

(22) PCT Filed: Mar. 25, 2003

(86) PCT No.: PCT/GB03/01266

§ 371 (c)(1),  
(2), (4) Date: May 31, 2005

(87) PCT Pub. No.: WO03/083874

PCT Pub. Date: Oct. 9, 2003

(65) Prior Publication Data

US 2005/0226103 A1    Oct. 13, 2005

(30) Foreign Application Priority Data

Mar. 27, 2002 (GB) ................................. 0207160.3

(51) Int. Cl.  
*G11C 19/08* (2006.01)

(52) U.S. Cl. .............................. 365/14; 365/33; 365/38

(58) Field of Classification Search .................. None  
See application file for complete search history.

(56) References Cited

U.S. PATENT DOCUMENTS

| | | | |
|---|---|---|---|
| 3,774,179 A | 11/1973 | Wiegand et al. | 340/174 |
| 3,811,120 A | 5/1974 | Bobeck | 340/174 |
| 6,867,988 B2 * | 3/2005 | Cowburn | 365/41 |
| 2007/0030718 A1 * | 2/2007 | Cowburn | 365/55 |
| 2007/0047156 A1 * | 3/2007 | Cowburn et al. | 360/324.1 |
| 2007/0262301 A1 * | 11/2007 | Cowburn et al. | 257/40 |

FOREIGN PATENT DOCUMENTS

| | | |
|---|---|---|
| WO | WO 01/31789 A2 | 5/2001 |
| WO | WO 02/13208 A1 | 2/2002 |
| WO | WO 01/31789 A3 | 5/2002 |

OTHER PUBLICATIONS

Nicolaescu, D., et al., "Vacuum microelectronics devices based on the controlled electron motion in electric and magnetic fields," Eur. Phys. J. AP, 2000, 10:33-42.  
Allwood, D.A., et al., "Submicrometer Ferromagnetic NOT Gate and Shift Register," Science, Jun. 14, 2002, 296:2003-2006.  
Taniyama et al. (Jan. 31, 2000) "Control of Domain Structures and Magnetotransport Properties in Patterned Ferromagnetic Wires" *Applied Physics Letters* 76(5):613-615.  
Ono et al. (2001) "Magnetization reversal and electric transport in ferromagnetic nanowires" *Materials Science and Engineering B* 84:126-132.

* cited by examiner

*Primary Examiner*—Tan X Dinh  
(74) *Attorney, Agent, or Firm*—McDonnell Boehnen Hulbert & Berghoff LLP

(57) ABSTRACT

A data storage device for storing digital information in a readable form is described made up of one or more memory elements, each memory element comprising a planar magnetic conduit capable of sustaining and propagating a magnetic domain wall formed into a continuous propagation track. Each continuous track is provided with at least one and preferably a large number of inversion nodes whereat the magnetization direction of a domain wall propagating along the conduit under action of a suitable applied field, such as a rotating magnetic field, is changed.

16 Claims, 8 Drawing Sheets

DATA STORAGE DEVICE

BACKGROUND

1. Technical Field

The examples of embodiments relate to a data storage device for the storage of digital information such as computer files, digital music, digital video etc., and, in particular, to a data storage device to which data can be written and read back an unlimited number of times.

2. Description of Related Art

A wide range of data storage devices has become available in recent years employing a range of media for a range of digital data storage applications. Data storage devices are designed which are adapted to some of a variety of operational characteristics, including capacity, speed of access, write/rewrite ability, ability to retain data stably over time (with or without power), size, robustness, portability and the like.

Known data storage devices include magnetic tape storage, magnetic hard disk storage, and optical disk storage. All offer advantages of good storage capacity and relatively rapid data access, and all can be adapted for ready write and rewrite of data. All require moving parts in the form of electromechanical or optical readers. This can limit the extent to which devices incorporating such data storage media can be miniaturized, and limit the use of the device in high-vibration environments. Although in each case the surface medium is the key to data storage, the mechanisms involved require careful control of properties also of any supporting substrate. Thus, such devices have to be of carefully controlled construction. Moreover all require the reader to have access to the surface of the device, which can place limitations on design freedom for the device.

SUMMARY

It is an object of the examples of embodiments to provide an alternative digital data storage device which offers versatility in alternative situations, in particular for example which can be miniaturized, and/or which can be incorporated into other devices such as smart cards, identification tags and patches or the like, and/or which can be incorporated onto flexible substrates, and/or which can be used in high-vibration environments, and/or which is of simple/low cost manufacture etc.

It is a particular object of the examples of embodiments to provide a data storage device which compactly and effectively stores digital data and provides for data to be written to the device and read back an unlimited number of times.

Thus, according to examples of embodiments, a data storage device for storing digital information (such as computer files, digital music, digital video, etc.) in a readable form comprises one or more, and in particular a plurality of, memory elements, each memory element comprising a planar magnetic conduit capable of sustaining and propagating a magnetic domain wall formed into a continuous propagation track, wherein each continuous track is provided with at least one and optionally a plurality and in particular a large number of inversion nodes whereat the magnetization direction of a domain wall propagating along the conduit under action of a suitable applied field is changed and in particular substantially reversed.

Each conduit is formed into a continuous propagation track. Conveniently a conduit is formed into a closed loop to comprise such a continuous propagation track. Such a loop is provided with at least one and optionally a plurality and in particular a large number of inversion nodes. Data is able to pass around the closed loop in accordance with the mechanism outlined below. In a variant, the magnetic conduit does not form an entire closed loop of inversion nodes, but rather a linear chain of inversion nodes with means to transfer data between the two ends thereof so that data is still able to circulate around an apparently closed loop, for example comprising a data writing facility at one end of the chain and data reading facility at the other end of the chain, and additional circuitry to feed the data back electronically from the output of the chain to the input of the chain.

Conveniently the inversion nodes comprise features in the structure and shape of the conduit which are so adapted as to cause a change in the magnetization direction, and preferably a substantial reversal in the magnetization direction, of a domain propagating thereacross under action of a suitable applied field, such as a directionally varying and in particular a rotating magnetic field.

It is nevertheless necessary that the conduit direction and hence the domain wall propagation direction varies without sharp discontinuities at any point. Thus, the conduit in the region of and comprising the inversion node must have configurational features such as to cause a change in the magnetization direction, and preferably a substantial reversal in the magnetization direction, of a domain propagating thereacross but without any specific sharp variation in propagation direction.

In a preferred embodiment, an inversion node comprises a substantial reversal of magnetization direction at the inversion node. Preferably, the inversion node comprises a portion in which a direction change away from the initial path and a subsequent direction change back to the initial path are provided in the conduit such that no direct propagation path is possible across the deviating portion. In particular, deviations comprise 90° deviations from the initial path. For the reasons indicated, deviations from the initial path preferably occur gradually over a distance along the conduit track.

For example, the inversion node comprises a cycloidal portion within the conduit loop structure, in particular directed internally, or a topological equivalent of such a structure.

Preferably, a plurality of such cycloidal portions are provided in each loop. Thus a device in accordance with the examples of embodiments preferably comprises a number of magnetic conduits formed into closed loops each comprising a plurality of cycloids serving to effect abrupt directional reversals in a magnetization direction of a domain wall passing thereacross and hence serving as inversion points for domain walls as they are propagated along the conduit of the device by a suitable driving field.

Preferably, each cycloid has a turning radius which is in the range of three to ten times the conduit width. Preferably, the cycloid is such as to produce a substantial change, for example a substantial 180° reversal, of magnetization direction as a domain wall passes therethrough.

In accordance with the present data storage device, the magnetic conduit needs to have architecture capable of sustaining and propagating a domain wall under action of a controlling field. Typically, the magnetic conduit may be formed as a continuous track of magnetic material. Thus, the loops in the device preferably comprise magnetic wires, in particular generally planar magnetic wires on a suitable substrate.

The data storage device thus uses a number of planar magnetic conduits and in particular magnetic wires which are preferably shaped into closed loops of cycloids. In particular, the device employs magnetic nanoscale technology, the device comprising a number of planar magnetic nanowires preferably formed into a plurality of closed loops of cycloids.

The planar magnetic nanowires are preferably less than 1 μm in width and are formed onto any suitable substrate. Width is a tradeoff between the improved storage capacity of devices employing narrower nanoscale wires and fabrication costs and complexities. However, devices incorporating wires above one micron are unlikely to be effective, and 50 nm is a likely practical lower limit of cost-effective practicality for current wire forming techniques. It should be emphasized that it is not a technical effect limit, and that improved fabrication techniques could render further miniaturized data storage devices in accordance with examples of embodiments practical.

The wires are deposited on a substrate in the form of a thin layer of magnetic material. Wire thickness is optimized for optimum performance of the device, and is broadly a function of width. In particular, wire thickness is generally around 1/40th of wire width. Wire thickness is generally not less than 2 nm, and preferably not less than 3 nm. Wires are in practice unlikely to be more than 25 nm thick.

The wires can be fabricated by optical lithography, X-ray lithography, micro-contact printing, e-beam lithography, deposition through a shadow mask or by some other suitable method. The wires are made from a magnetic material such as Permalloy ($Ni_{80}Fe_{20}$) or CoFe or some other soft magnetic material.

The data storage device incorporating inversion nodes as described above is subject to the application of a suitable directionally varying and in particular rotating magnetic field in a manner of operation described in greater detail below, which gives the inversion node a memory function. The provision of a plural array of loops each incorporating one or more inversion nodes allows a device in accordance with examples of embodiments to store data serially in a ring.

Data can be written to a device in accordance with examples of embodiments and read back an unlimited number of times. Unlike magnetic tape storage or magnetic hard disk storage, the present data storage device requires no moving parts. Consequently, it can be easily miniaturized and used in high-vibration environments. The principle of the present data storage device is very simple, and manufacturing costs can be kept low. Moreover, no power is required to retain data in the memory of the present data storage device when it is not in use.

The present data storage device uses a number of magnetic conduits such as planar magnetic wires. The planar wires are formed on some substrate, but unlike microelectronic memory, this substrate plays no role in the electronic or magnetic operation of the device, serving essentially only to provide mechanical support. Conventional silicon substrates may still be used, but since no functionality is necessary from the substrate, materials other than silicon may also be used, such as glasses or plastics. Examples include polyimide such as Kapton, polyethylene terephthalate or Mylar-type materials, acetate, polymethylmethacrylate or other. Plastic substrates have the advantage of low cost and simplicity of fabrication and also offering the potential for mechanical flexibility which makes the present data storage device suitable for integration into plastic cards such as Smart Cards, or into clothing.

Because no mechanical access is required to the surface of the present data storage device, as is required in compact disc, magnetic tape and magnetic hard disk storage, a large number of substrates can be stacked on top of each other to form a 3-dimensional memory cube.

The present data storage device's areal storage density is moderate, being higher than magnetic tape but lower than magnetic hard disks. Reading and writing data rates can be very high if required, and even higher than hard disk drive rates. However, the present data storage device stores data serially in a ring, and so access time to a given block of data is likely to be relatively slow, making the present data storage device of limited applicability as a direct replacement for the primary hard disk drive in computers.

International patent application PCT/GB01/05072 describes how digital logic circuits could be constructed from chains of nanometer scale dots of magnetic material, or nanometer scale planar magnetic wires. In particular is described a magnetic NOT-gate which is shown in FIG. 1 of the present application.

In FIG. 1, the arrows represent magnetization direction within the narrow strips of magnetic material which form the gate 100. The central structure 102 of the gate 100 reverses the direction of magnetization coming in from the left.

In use, the gate 100 is to be placed in a magnetic field, the vector of which rotates in the plane of the device with time. While the present data storage device is not limited by any theory of operation, it can be noted that because of magnetic shape anisotropy, the magnetization in the wire is generally confined to lie along the long axis of the wire. This means that there are two possible magnetization directions and so there exists a natural binary representation. A change in magnetization direction is mediated by a magnetic domain wall being swept along the wire by the applied field. The fact that the applied field rotates means that domain walls can be carried around corners.

In accordance with examples of embodiments, a NOT-gate similar to the one described above is fabricated by a suitable method. Ideally for present purposes, the shape of the gate is modified slightly from that shown in FIG. 1 to have a cycloidal shape. The output of the gate is connected back into its input using a suitable magnetic conduit such as a planar magnetic wire to form a closed loop. An array of such loops forms the present data storage device according to this preferred embodiment, which comprises planar magnetic nanowires formed into large closed loops of serially connected cycloids to form chains of magnetic NOT gates. The output of the last NOT gate in each chain is fed back into the input of the first NOT gate by a planar magnetic wire so as to form a closed loop for the data sequence to circulate around.

The cycloids serve as inversion nodes for propagating domain walls as they propagate through the nanowires under action of a suitable rotational operating field in the manner noted above and described in greater detail below. The inverted output only appears after a time delay equal to one half of the period of the rotational applied field, which makes each inversion node appear as a single bit memory cell or flip-flop. Thus, the loops of cycloids have the same memory function as a serial circular shift register, and can serve as a data storage device in accordance with examples of embodiments.

According to a further aspect of the present data storage device, a data storage system is provided comprising one or more device elements as above described and further comprising a magnetic field driver for providing a controlled time-varying driving magnetic field. The magnetic field driver is preferably set up such that the driving field is applied simultaneously to all of the cycloids in a given loop and may be applied simultaneously to all of the loops in the system. This gives a distinctive feature of the present system in operation. The magnetic field is applied to the entire loop at once so that all of the data bits advance together, instead of only locally under the write head as would be the case with conventional magnetic data storage.

Any suitable field may be envisaged. Preferably, the magnetic field driver provides a controlled magnetic field consisting of two orthogonal fields operating in a predetermined sequence, preferably alternating, and more preferably forming a clocking field in a clockwise or anti-clockwise direction. Using such a system, data may be stored in the storage device (s) in accordance with the first aspect of the present data storage device.

The system may further comprise suitable electrical and/or data input and/or outputs to enable the data storage device to be used in a memory storage and retrieval system.

These as well as other aspects and advantages will become apparent to those of ordinary skill in the art by reading the following detailed description, with reference where appropriate to the accompanying drawings.

BRIEF DESCRIPTION OF THE DRAWINGS

Various examples of embodiments are described herein with reference to the following drawings, wherein like numerals denote like entities.

DETAILED DESCRIPTION OF THE DRAWINGS

An example of the operation of the present magnetic data storage device will now be described by way of example, with reference to FIGS. 2 to 8.

Figure 1:
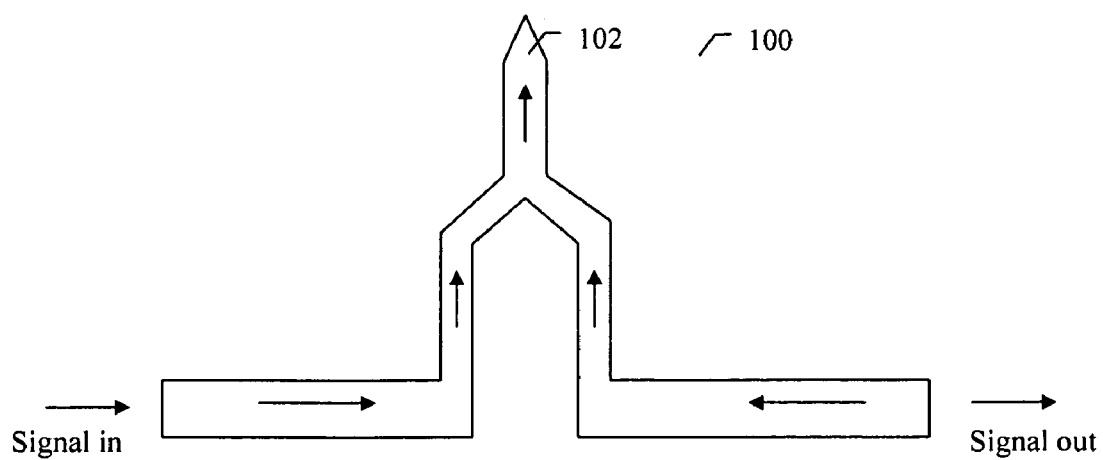
FIG. 1 is a schematic representation of a prior art magnetic NOT-gate (see above)
Figure 2:
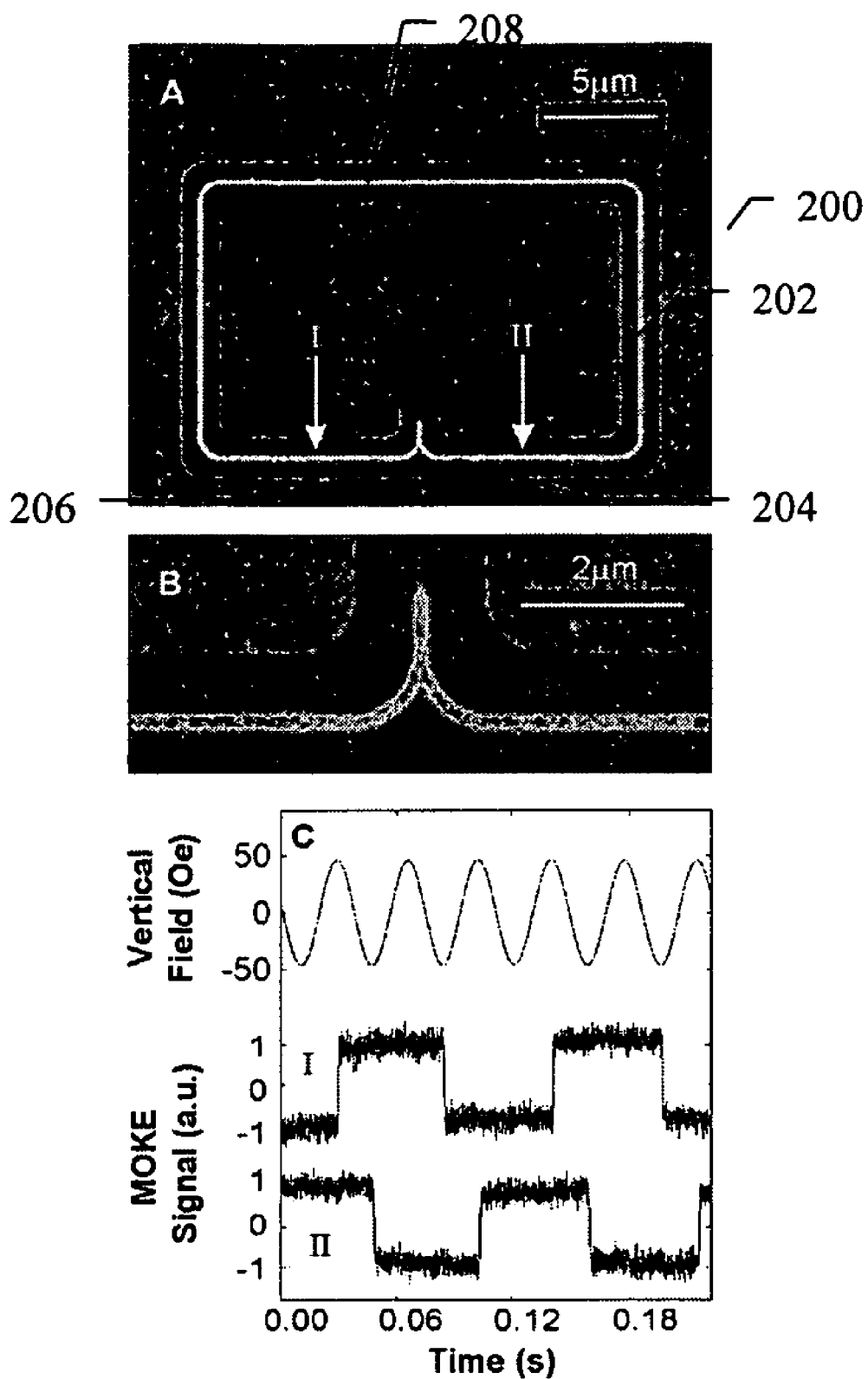
FIG. 2 is a magnetic NOT gate modified for use as a data storage device in accordance with examples of embodiments.

FIG. 2 shows a NOT gate 200 similar to the gate 100 of FIG. 1, but particularly adapted to be optimized for the present data storage device to have a cycloidal shape. The gate 200 is made by focused ion beam milling of a 5 nm thick Permalloy ($Ni_{80}Fe_{20}$) film on a silicon substrate. Only the bright white shaded portion 202 is magnetic material; other contrast is due to the multi-step milling process used during the fabrication of the gate. FIG. 2a shows the gate 200 with its output 204 connected back to its input 206 using a planar magnetic wire 208 to form a closed loop. FIG. 2b shows a close up of the gate structure, which has a cycloidal form. Magnetooptical measurements at points I and II in response to an applied rotating magnetic field are shown in FIG. 2c. There is a half-cycle delay between the input (trace I) changing state and the output (trace II) changing state equal to one half of the period of the applied rotating magnetic field, which corresponds to a memory function.

Figure 3:
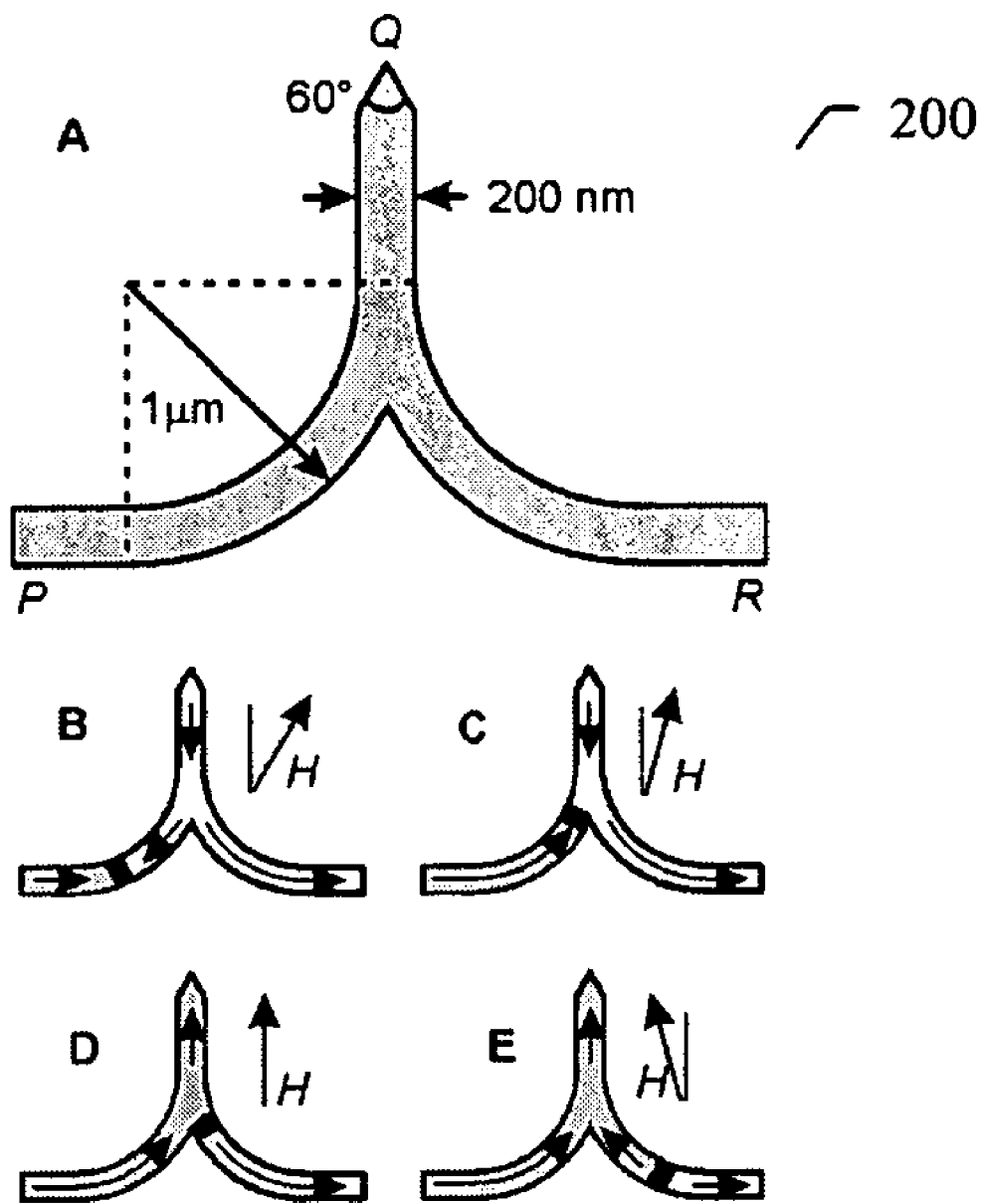
FIG. 3 is a schematic representation of the structure of the NOT gate of FIG. 2 (Part A) and of its effect on a domain wall entering at point P under the action of a rotating magnetic field H.

FIG. 3 gives an explanation of the inverting action of the cycloid and in particular of the origin of this delay.

Under low magnetic field conditions, the magnetization direction within sub-micron ferromagnetic planar wires tends to lie along the wire long-axis due to strong magnetic shape anisotropy. When two oppositely directed magnetizations meet within a wire, the re-alignment of successive atomic magnetic moments is not abrupt but occurs gradually over a certain distance to form a domain wall.

It is now known that domain walls can propagate along straight sub-micron magnetic wires by application of a magnetic field parallel to the wire. In use of the present data storage device, a magnetic field is applied with a vector that rotates with time in the sample plane can be used to propagate domain walls along magnetic wires that also change direction and turn corners. The clockwise or counter-clockwise rotation defines the magnetic field chirality. A domain wall should propagate around a magnetic wire corner providing that the field and corner are of the same chirality. However, the chirality of a corner depends upon the direction of domain wall propagation so that, within a rotating magnetic field of given chirality, a domain wall will only be able to pass through a given corner in one direction. This satisfies the important requirement of any logic systems that a definite signal flow direction must exist. The two stable magnetization directions within sub-micron magnetic wires provide a natural means of representing the two Boolean logic states and this, together with application of a rotating magnetic field, is the basis of operation of each logical unit of the memory device.

The cycloid 200 illustrated in FIG. 3 provides an inverting function and demonstrates NOT-gate functionality when within a suitable rotating magnetic field. Suppose the magnetic field is rotating in a counter-clockwise sense. A domain wall arriving at terminal 'P' (FIG. 3B) of the junction will propagate around the first corner of the junction (FIG. 3C) and through to terminal 'Q' as the applied field rotates from the horizontal to the vertical direction. The magnetization between 'P' and 'Q' will now be continuous (FIG. 3D). Then, as the magnetic field vector continues to rotate towards the opposite horizontal direction, the domain wall should propagate around the second corner of the junction (FIG. 3E), exiting at terminal 'R' and restoring continuous magnetization between 'Q' and 'R'. The magnetization of the wire 208 immediately after the junction should now be reversed compared with that immediately before the junction. The junction should therefore perform the desired NOT-function with a half field-cycle propagation delay. This operation is analogous to a car reversing its direction by performing a three-point turn.

There is thus a half-cycle total delay between the wall arriving at the input 206 and leaving from the output 204. In accordance with examples of embodiments, we identify that this synchronous delay has an associated memory function which can be exploited by connecting a large number of magnetic NOT gates, such as the gate 200, together in series, and then piping the output of the chain back to the input.

Figure 4:
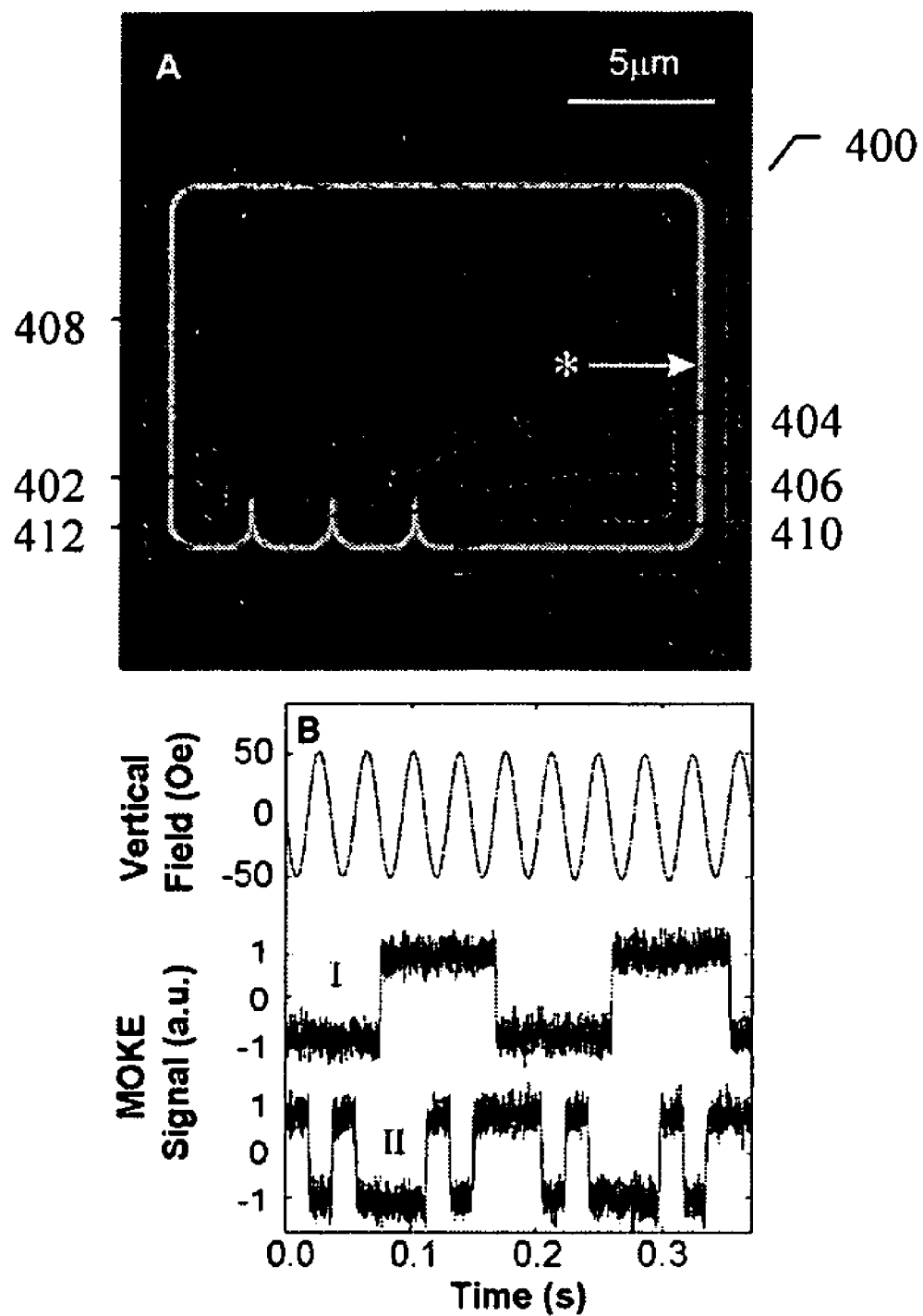
FIG. 4 shows three magnetic NOT gates connected in a ring to form a 5-bit serial shift register in Part A, and Part B shows how simple (trace I) and complex (trace II) bit sequences can be forced to circulate around the ring by the application of a rotating magnetic field (the asterisk in Part A showing the point in the loop where the measurements shown in Part B were made)

FIG. 4 shows a reduced version 400 of the present data storage device in which three NOT gates 402, 404, and 406 have been connected in a chain 408, and the output 410 of the chain 408 fed back into the beginning 412 of the chain 408 by a planar magnetic wire 414. We have programmed two different data bit sequences into the device 400 through a specific application of magnetic fields and then started to cycle the data around the loop by starting the rotating magnetic field.

Trace I of FIG. 4b shows a simple bit-sequence cycling around the chain 408; the pattern repeats every 5 cycles of the rotating field. Trace II of FIG. 4b shows a more complex sequence cycling around the loop, with a period of 5 cycles of the rotating field. The device 400 is effectively behaving as a 5-bit serial shift register. The data bit sequence takes one step to the right on each complete cycle of the rotating field. These data were obtained using a counter-clockwise rotating field and so the data were cycling around the magnetic ring in a counter-clockwise sense. We find that reversing the rotating sense of the field to clockwise causes the data to reverse direction and to begin to cycle around the magnetic ring in a clockwise sense.

Figure 5:
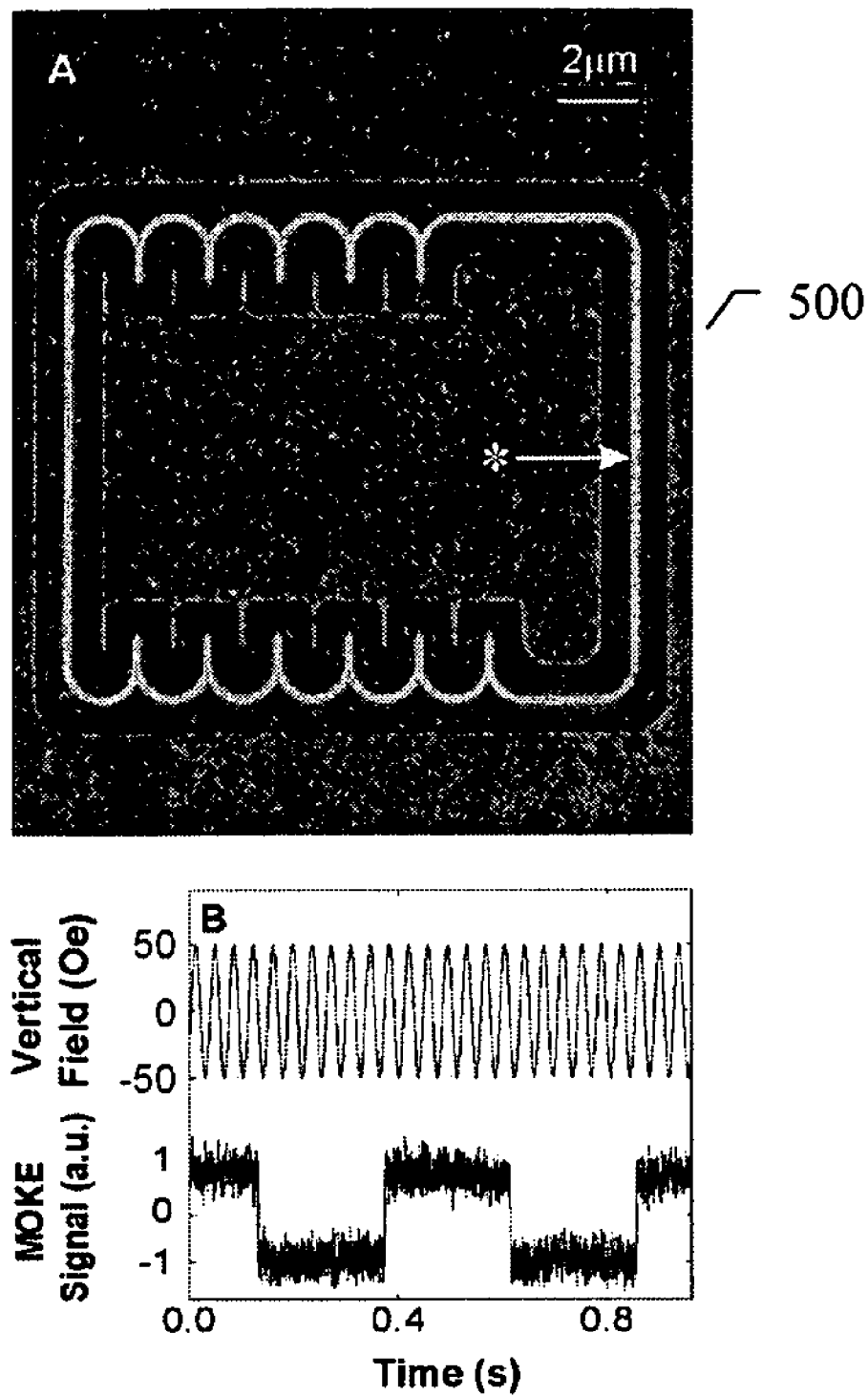
FIG. 5 shows eleven magnetic NOT gates connected in a ring to form a 13-bit serial memory in Part A, and Part B shows a simple 13-bit data sequence cycling around the loop under the action of a rotating magnetic field (the asterisk in Part A showing the point in the loop where the measurements shown in Part B were made).

FIG. 5 shows a test of a version 500 of the present data storage device using 11 NOT gates. FIG. 5b shows a simple bit sequence cycling around the loop with a repeat period of 13 cycles of the rotating field.

Data are written into each loop by a current-carrying lithographic wire passing over the top or underneath the planar magnetic wire. Data are read out of each loop by using a magnetic tunnel junction attached to one part of the loop or by measuring the electrical resistance of a domain wall present at one of the corners of the wire or by measuring the electrical resistance of a domain wall present in one of the NOT gates.

Figure 6:
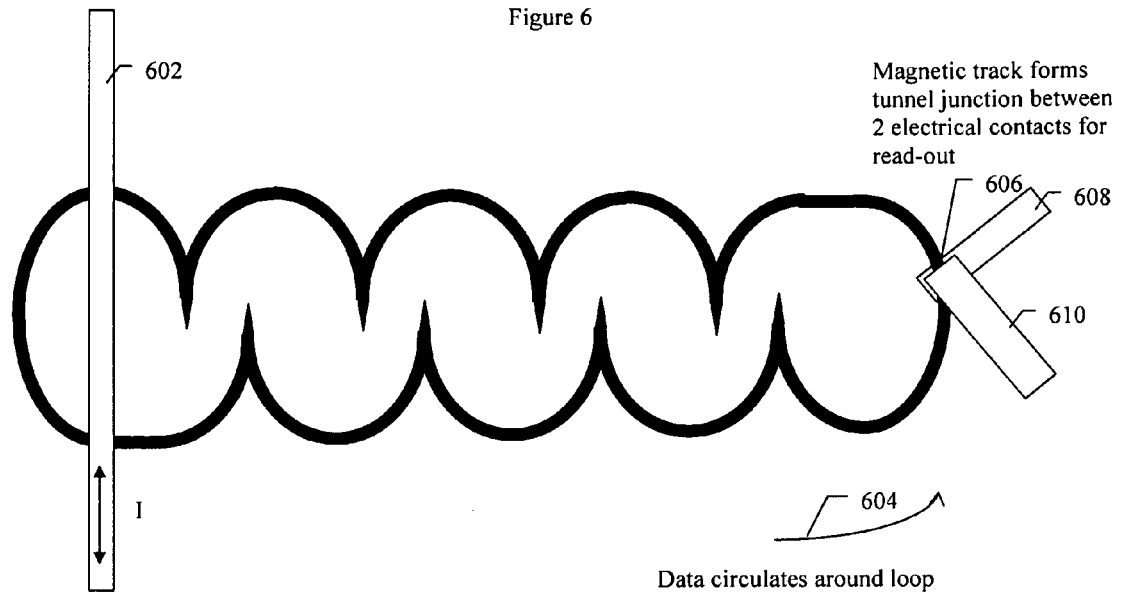
FIG. 6 is a schematic illustration of the data writing and read-out mechanism in accordance with examples of embodiments.
Figure 6:
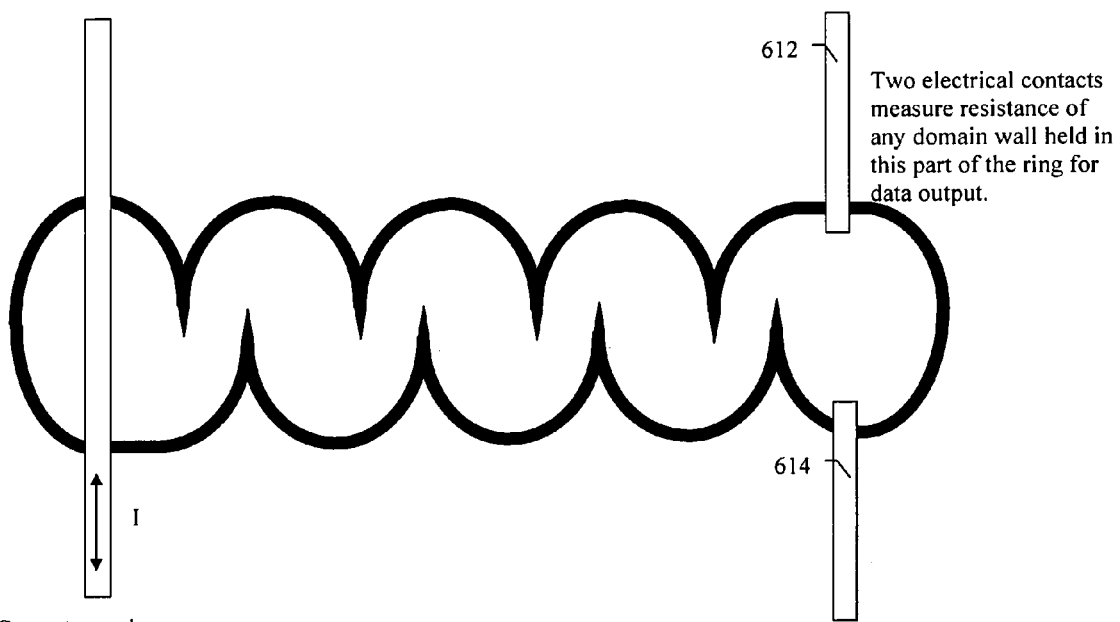

FIG. 6 shows examples of these data input/output methods. Data is written into the loop by a current carrying electrical lithographic wire 602 which passes above or beneath the ring. Data circulates around the loop in the direction of arrow 604. Data is read out of the loop either by forming a magnetic tunnel junction 606 between two electrical contacts 608 and 610 at one point of the loop (upper panel) or by applying two electrical contacts 612 and 614 to measure the resistance of any domain wall contained within a small part of the ring (lower panel).

In a variant on the present data storage device (not shown in the figure), the magnetic conduit itself does not form a closed loop of inversion nodes, but rather a linear chain of inversion nodes with data writing facility at one end of the chain and data reading facility at the other end of the chain. In this case, it is necessary for external control circuitry to feed the data back electronically from the output of the chain to the input of the chain so that data is still able to circulate around an apparently closed loop.

The data loops sit in a magnetic field, the vector of which rotates in the plane of the loops with time at a frequency in the range 1 Hz-200 MHz. The field magnitude may be constant as the field rotates, thus forming a circular locus for the magnetic field vector, or it may vary, thus forming an elliptical locus for the magnetic field vector. This can be achieved in small area devices by placing an electromagnetic strip line underneath the loops and then passing an alternating current through the strip line. In a larger area device, the substrate carrying the loops is placed within a quadrapole electromagnet.

The field magnitude should be strong enough to ensure that a domain wall can be pushed all the way through each NOT gate, but not so strong that new domain walls can be nucleated independently of the data input mechanism. The field required to push a domain wall through each NOT gate can be tuned by varying the thickness of the loops, the width of the loops, and the magnetic material used to make the loops. This field should be large enough that the device does not suffer erasure from stray ambient magnetic fields. The present data storage device may be shielded using MuMetal if stray field erasure is a problem. An optimized device will use applied field strengths in the range of 50-200 Oe.

Figure 7:
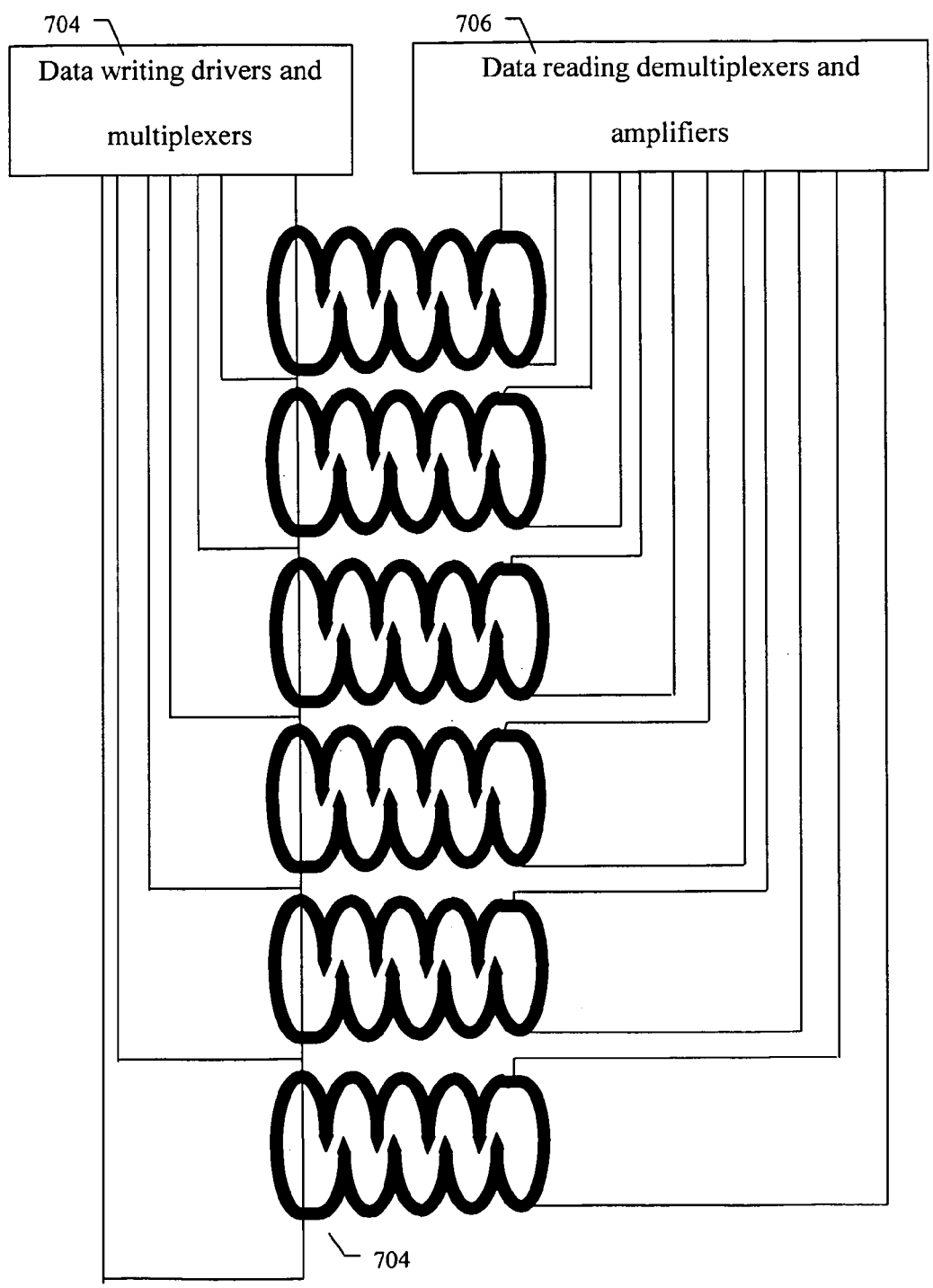
FIG. 7 is a schematic illustration of a number of magnetic loops on the same substrate, addressed individually by electronic multiplexers and demultiplexers.

The present data storage device may comprise a large number of data loops on a single substrate with electronic multiplexers and demultiplexers being used to address the correct loop, as illustrated in FIG. 7. A number of loops 702 are shown between data writing drivers and multiplexers 704 and data reading demultiplexers and amplifiers 706.

An optimal balance between the number of loops 702 and the number of NOT gates in each loop 702 will be found for a given application. A small number of loops 702 each comprising a large number of NOT gates will be very easy and cheap to integrate into a package but will be prone to failure of the entire device if a single NOT gate fails through manufacturing defects. Such a combination will also have a long data access time, as one must wait a large number of clock cycles on average for a given data block to cycle round to the reading position. A large number of loops 702 each comprising a small number of NOT gates will be very resistant to failure of individual NOT gates (the loop 702 containing the failed gate can be taken out of circuit without significantly reducing the overall storage capacity) and will have a rapid access time, but will involve more reading and writing points (and therefore higher cost) and it will be more complicated to integrate a large number of loops 702 into a single integrated circuit package. All of the figures in this document show loops of 8 gates. This is purely figurative—in practice each loop will contain many thousands of gates.

Figure 8:
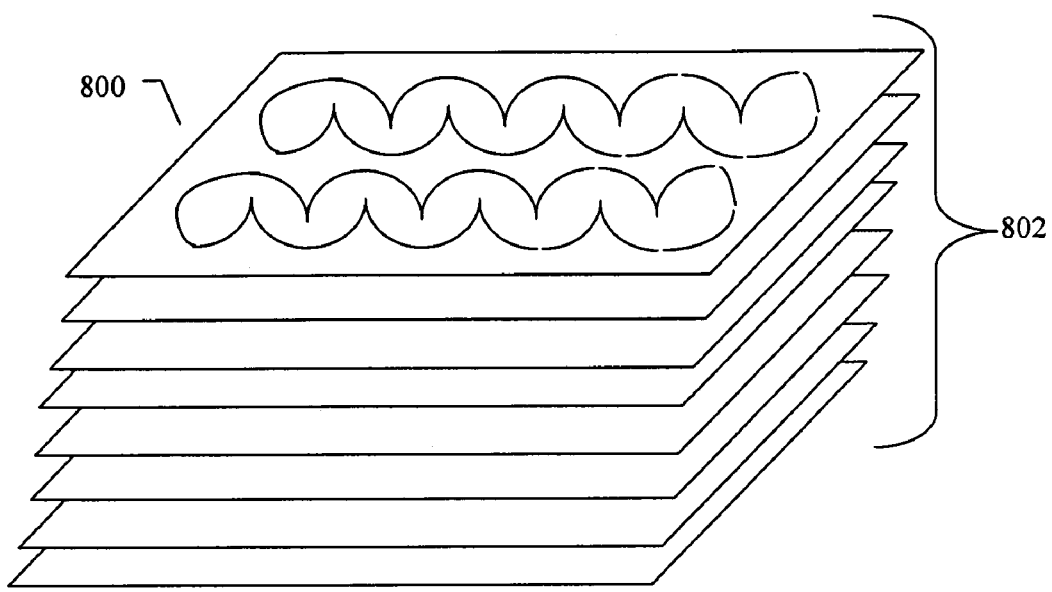
FIG. 8 is a schematic illustration of the stacking of a number of substrates each containing a number of data loops to form a 3-dimensional memory cube.

A particular feature of the present data storage device is that one is not limited to a 2-dimensional plane in placing data loops. Unlike compact disc, magnetic tape, and magnetic hard disk storage, no mechanical access is required to the surface of the present data storage device. Substrates 802 may be placed on top of each other to form a 3-dimensional data cube 800, as shown in FIG. 8. This has the advantage of allowing much higher data storage densities to be achieved. If desired, all of the substrates 802 in a cube 800 may share the same applied rotating magnetic field, thus keeping the layers in synchronization with each other and reducing the complexity of the device.

The present data storage device may be configured to input/output a single serial stream of data, or if desired, streams of data words of multiple bit width may stored by using several rings or layers in parallel.

Because of the low access time, the present data storage device is not suitable as a replacement for the primary hard disk in computers. It may, however, find application in some of the following situations, as well as others.

Temporary storage of digital music for pocket digital audio players such as MP3 players. This application requires low-cost, non-volatile, re-writable storage of digital information which is usually replayed serially. Using 200 nm-wide planar wires, a NOT gate would occupy an area of 1 $\mu m^2$. A 1 $cm^2$ single layer covered with data chains would therefore provide 12 Mbytes of serial data storage, which is sufficient for 12 minutes of CD-quality music. Stacking of layers will provide several hours of CD-quality audio at very low cost.

Temporary storage of digital photographs in digital cameras. This function is accomplished currently by FLASH electronic memory, which is expensive and which has a limited number of re-write cycles.

Non-volatile offline storage for mobile phones, personal organizers, palm top computers, and SMART cards.

Various examples of embodiments have been described above. Those skilled in the art will understand, however, that changes and modifications may be made to those examples without departing from the scope of the claims.

The invention claimed is:

1. A data storage device for storing digital information in a readable form comprises one or more memory elements, each memory element comprising a planar magnetic conduit capable of sustaining and propagating a magnetic domain wall formed into a continuous propagation track, wherein each continuous track is provided with at least one inversion node whereat the magnetization direction of a domain wall propagating along the conduit under action of an applied field is changed, each inversion node comprising a portion in which a direction change away from an initial path and a subsequent direction change back to the initial path are provided in the conduit such that no direct propagation path is possible across a deviating portion.

2. The data storage device of claim 1 wherein each continuous track is provided with at least one inversion node whereat the magnetization direction of a domain wall propagating along the conduit under action of a suitable applied field is substantially reversed.

3. The data storage device of claim 1 wherein each continuous track is provided with a large plurality of inversion nodes.

4. The data storage device of claim 2 wherein each continuous track is provided with a large plurality of inversion nodes.

5. The data storage device of claim 1 wherein a conduit is formed into a closed loop to comprise a continuous propagation track.

6. The data storage device of claim 2 wherein a conduit is formed into a closed loop to comprise a continuous propagation track.

7. The data storage device of claim 3 wherein a conduit is formed into a closed loop to comprise a continuous propagation track.

8. The data storage device of claim 1 wherein a conduit does not form an entire closed loop but a chain of inversion nodes, and means are provided to transfer data between the two ends thereof so that data is still able to circulate around an apparently closed loop, the means comprising a data writing facility at one end of the chain and data reading facility at the other end of the chain, and additional circuitry to feed the data back electronically from the output of the chain to the input of the chain.

9. The data storage device of claim 1 wherein deviations comprise 90° deviations from the initial path of the conduit.

10. The data storage device of claim 1 wherein deviations from the initial path occur gradually over a distance along the conduit track.

11. The data storage device of claim 1 wherein the inversion node comprises a cycloidal portion within a conduit loop structure or a topological equivalent of such a structure.

12. The data storage device of claim 11 comprising a plurality of such cycloidal portions provided in each loop.

13. The data storage device of claim 12 comprising a number of magnetic conduits formed into closed loops each comprising a plurality of cycloids serving to effect abrupt directional reversals in a magnetization direction of a domain wall passing thereacross.

14. The data storage device of claim 13 wherein each cycloid has a turning radius which is in the range three to ten times the conduit width.

15. The data storage device of claim 1 wherein the magnetic conduit comprises a particular generally planar magnetic wire on a suitable substrate.

16. The data storage device of claim 15 wherein the magnetic wire comprises a magnetic nanowire with a thickness of between 2 nm and 25 nm and a width of between 50 nm and 1 µm.

* * * * *